United States Patent
Ito et al.

(10) Patent No.: US 8,133,821 B2
(45) Date of Patent: Mar. 13, 2012

(54) METHOD OF MANUFACTURING POROUS INSULATING FILM, METHOD OF MANUFACTURING SEMICONDUCTOR DEVICE, AND SEMICONDUCTOR DEVICE

(75) Inventors: Fuminori Ito, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 37 days.

(21) Appl. No.: 12/620,913

(22) Filed: Nov. 18, 2009

(65) Prior Publication Data
US 2010/0123223 A1 May 20, 2010

(30) Foreign Application Priority Data
Nov. 18, 2008 (JP) ................................. 2008-294090

(51) Int. Cl.
*H01L 23/48* (2006.01)
(52) U.S. Cl. .................. 438/780; 438/781; 438/796

(58) Field of Classification Search .................. 438/780, 438/781, 796
See application file for complete search history.

(56) References Cited

FOREIGN PATENT DOCUMENTS

| JP | 2004-274052 | 9/2004 |
|---|---|---|
| JP | 2005-524983 | 8/2005 |
| JP | 2007-204850 | 8/2007 |
| WO | WO 2005/053009 | 6/2005 |

*Primary Examiner* — Long Pham
(74) *Attorney, Agent, or Firm* — Young & Thompson (57) ABSTRACT

A method includes forming an insulating film over a substrate by introducing a cyclic siloxane compound having a cyclic siloxane as a skeleton and having at least one volatile hydrocarbon group bonded to a side chain, and a silicon-containing compound into a plasma, and converting the insulating film to a porous insulating film by adding energy to the insulating film. The silicon-containing compound is decomposed using less energy as compared with the skeleton of the cyclic siloxane compound, the volatile hydrocarbon group, and the bond between the cyclic siloxane compound and the volatile hydrocarbon group.

12 Claims, 4 Drawing Sheets

METHOD OF MANUFACTURING POROUS INSULATING FILM, METHOD OF MANUFACTURING SEMICONDUCTOR DEVICE, AND SEMICONDUCTOR DEVICE

This application is based on Japanese Patent Application No. 2008-294090, the content of which is incorporated hereinto by reference.

BACKGROUND

1. Technical Field

The present invention relates to a method of manufacturing a porous insulating film, a method of manufacturing a semiconductor device, and a semiconductor device.

2. Related Art

In recent years, as line width reduction of interconnect progresses, there has been a problem caused by an increase in the interconnect capacity. In order to suppress the increase in the interconnect capacity, it is effective to lower the dielectric constant of the insulating film in which interconnects are buried. As a method of lowering the dielectric constant of an insulating film, there may be mentioned a method of using an insulating material having a lower relative permittivity than that of silicon oxide, in the insulating film.

More recently, the development of a porous insulating film having fine pores introduced into the insulating film is in progress, in order to further lower the dielectric constant of the insulating film. The porous insulating film is formed by separately introducing a precursor of the insulating film and a porogen into a vacuum vessel, forming an insulating film containing the porogen, and removing the porogen from the insulating film by a heat treatment or the like (see, for example, Japanese Unexamined patent publication NO. 2004-274052, Japanese translation of PCT international application NO. 2005-524983, and Japanese Unexamined patent publication NO. 2007-204850).

WO 2005/053009 describes a technique of forming a porous insulating film using an organic silica compound having a cyclic silica skeleton. It is described in this technique that the cyclic silica skeleton corresponds to the pores.

In the case of forming an insulating film containing a porogen by separately introducing a precursor of the insulating film and the porogen into a vacuum vessel, the porogen aggregates upon being incorporated into the insulating film, and thereby the size of the pores in the porous insulating film undergoes enlargement. Furthermore, in the technique described in WO 2005/053009, sufficient strength of the porous insulating film could not be secured.

SUMMARY

In one embodiment, there is provided a method of manufacturing a porous insulating film including: forming an insulating film over a substrate by introducing a cyclic siloxane compound including a cyclic siloxane as a skeleton and including at least one volatile hydrocarbon group bonded to a side chain, and a silicon-containing compound, into a plasma; and converting the insulating film into a porous insulating film by adding energy to the insulating film, wherein the silicon-containing compound is decomposed using less energy as compared with the skeleton of the cyclic siloxane compound, the volatile hydrocarbon group, and the bond between the cyclic siloxane compound and the volatile hydrocarbon group.

According to the invention, since use is made of a cyclic siloxane compound having a cyclic siloxane as a skeleton and having at least one volatile hydrocarbon group bonded to a side chain, even if a porogen is not added upon forming an insulating film, a volatile hydrocarbon is introduced into the insulating film. The volatile hydrocarbon is bonded to the cyclic siloxane compound as a hydrocarbon group, and therefore, aggregation of the volatile hydrocarbon can be suppressed when the insulating film is formed. Accordingly, enlargement of the size of the pores in the porous insulating film can be suppressed.

The cyclic siloxane in the insulating film is bonded through the silicon contained in the silicon-containing compound. Therefore, the strength of the porous insulating film is increased.

In another embodiment of the invention, there is provided a method of manufacturing a semiconductor device, including forming a porous insulating film by the method of manufacturing a porous insulating film described above.

In another embodiment, there is provided a semiconductor device including:

a substrate; and a porous insulating film formed over the substrate, wherein the porous insulating film contains a plurality of cyclic siloxanes, and the elastic modulus measured by a nanoindenter is equal to or greater than 5.

According to the invention, the size of the pores in the porous insulating film can be diminished, and the strength of the porous insulating film can be increased.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiments of the invention will be described with reference to the accompanying drawings. In all of the drawings, like a symbol is given to like constituent element, and the explanation thereof will not be repeated.

First, an outline of the method of manufacturing a porous insulating film according to an embodiment will be described. This method of manufacturing a porous insulating film includes introducing a cyclic siloxane compound having a cyclic siloxane as a skeleton and having at least one volatile hydrocarbon group bonded to a side chain, and a silicon-containing compound, into a plasma to form an insulating film over a substrate, and converting the insulating film to a porous insulating film by adding energy to the insulating film. The silicon-containing compound is decomposed using less energy as compared with the skeleton of the cyclic siloxane compound, the volatile hydrocarbon group, and the bond between the cyclic siloxane compound and the volatile hydrocarbon group. This method of manufacturing a porous insulating film is used as, for example, a part of the process for manufacturing semiconductor devices.

In regard to the step of forming an insulating film in this method of forming a porous insulating film, when the cyclic siloxane compound and the silicon-containing compound are introduced into the plasma, the insulating film is formed from the cyclic siloxane having a volatile hydrocarbon group bonded thereto. The cyclic siloxane molecules in the insulating film are bonded to each other through the silicon contained in the silicon-containing compound.

In regard to the step of converting the insulating film to a porous insulating film, when energy is added to the insulating film, the volatile hydrocarbon group contained in the insulating film is volatilized. Therefore, the portions where the volatile hydrocarbon groups were present in the insulating film, become pores, and thereby the insulating film is converted to a porous insulating film.

Hereinafter, the embodiments will be described in detail. First, the volatile hydrocarbon group, the cyclic siloxane compound, and the silicon-containing compound will be explained.

The volatile hydrocarbon group is a hydrocarbon group for forming pores in the insulating film, and is a hydrocarbon that can be used as, for example, a porogen. The volatile hydrocarbon group is, for example, one selected from the group consisting of the following (a) to (f):

(a) at least one cyclic hydrocarbon having a cyclic structure, represented by the formula:

$C_nH_{2n}$ (wherein n is 4 to 14; the number of carbon atoms in the cyclic structure is 4 to 10; and this at least one cyclic hydrocarbon may have a plurality of simple or branched hydrocarbons substituted at the cyclic structure);

(b) at least one linear or branched, saturated, mono- or polyunsaturated hydrocarbon represented by the formula:

$C_nH_{(2n+2)-2y}$ (wherein n is 2 to 20; and y is 0 to n);

(c) at least one mono- or polyunsaturated cyclic hydrocarbon having a cyclic structure, represented by the formula:

$C_nH_{2n-2x}$ (wherein x is the number of unsaturation sites; n is 4 to 14; the number of carbon atoms in the cyclic structure is 4 to 10; and this at least one mono- or polyunsaturated cyclic hydrocarbon may have a plurality of simple or branched hydrocarbon substituents substituted at the cyclic structure, and may have unsaturation in one of the hydrocarbon substituents or unsaturation within the ring);

(d) at least one bicyclic hydrocarbon having a bicyclic structure, represented by the formula:

$C_nH_{2n-2}$ (wherein n is 4 to 14; the number of carbon atoms in the bicyclic structure is 4 to 12; and this at least one bicyclic hydrocarbon may have a plurality of simple or branched hydrocarbons substituted at the bicyclic structure);

(e) at least one polyunsaturated bicyclic hydrocarbon having a bicyclic structure, represented by the formula:

$C_nH_{2n-(2+2x)}$ (wherein x is the number of unsaturation sites; n is 4 to 14; the number of carbon atoms in the bicyclic structure is 4 to 12; and this at least one polyunsaturated bicyclic hydrocarbon may have a plurality of simple or branched hydrocarbon substituents substituted at the bicyclic structure, or may have unsaturation in one of the hydrocarbon substituents or unsaturation within the ring); and (f) at least one tricyclic hydrocarbon having a tricyclic structure, represented by the formula:

$C_nH_{2n-4}$

(wherein n is 4 to 14; the number of carbon atoms in the tricyclic structure is 4 to 12; and this at least one tricyclic hydrocarbon may have a plurality of simple or branched hydrocarbons substituted at the tricyclic structure).

The size of pores in the porous insulating film can be controlled by the number of carbon atoms of the volatile hydrocarbon group, but this number of carbon atoms is preferably equal to or greater than 2 and equal to or less than 10.

The cyclic siloxane compound is, as previously described, a compound having a cyclic siloxane as a skeleton and having at least one volatile hydrocarbon group bonded to a side chain. The cyclic siloxane is, for example, a 6-membered ring, but it may also be a 4-membered ring, an 8-membered ring, a 10-membered ring, or a higher-membered ring.

When the cyclic siloxane compound is a 6-membered ring, for example, a trivinylcyclotrisiloxane monomer represented by the following formula (1) (wherein R1, R2 and R3 in the formula (1) may be identical or different, and each represent hydrogen, an alkyl group, an alkoxide group, an amino group, an alkene, an alkyne, a phenyl group, a phenol group or the like) may be used. However, at least one (preferably all) of R1, R2 and R3 is the volatile hydrocarbon group described above.

(1)

As for the cyclic siloxane compound, a divinylcyclotrisiloxane derivative represented by the following formula (4) (wherein R1, R2, R3 and R4 in the formula (4) may be identical or different, and each represent hydrogen, an alkyl group, an alkoxide group, an amino group, an alkene, an alkyne, a phenyl group, a phenol group or the like) may also be used. However, at least one (preferably all) of R1, R2, R3 and R4 is the volatile hydrocarbon group described above.

(4)

For the cyclic siloxane compound, a vinylcyclotrisiloxane derivative represented by the following formula (5) (wherein R1, R2, R3, R4 and R5 in the formula (5) may be identical or different, and each represent hydrogen, an alkyl group, an alkoxide group, an amino group, an alkene, an alkyne, a phenyl group, a phenol group or the like) may also be used. However, at least one (preferably all) of R1, R2, R3, R4 and R5 is the volatile hydrocarbon group described above.

(5)

When the cyclic siloxane compound is an 8-membered ring, for example, the cyclic siloxane compound is a tetravinylcyclotetrasiloxane monomer represented by the following formula (2) (wherein R1, R2, R3 and R4 in the formula (2) may be identical or different, and each represent hydrogen, an alkyl group, an alkoxide group, an amino group, an alkene, an alkyne, a phenyl group, a phenol group or the like). However, at least one (preferably all) of R1, R2, R3 and R4 is the volatile hydrocarbon group described above.

(2)

As for the cyclic siloxane compound, a trivinylcyclotetrasiloxane derivative represented by the formula (6) (wherein R1, R2, R3, R4 and R5 in the formula (6) may be identical or different, and each represent hydrogen, an alkyl group, an alkoxide group, an amino group, an alkene, an alkyne, a phenyl group, a phenol group, or the like) may also be used. However, at least one (preferably all) of R1, R2, R3, R4 and R5 is the volatile hydrocarbon group described above.

(6)

For the cyclic siloxane compound, a divinylcyclotetrasiloxane derivative represented by formula (7) or (8) (wherein R1, R2, R3, R4, R5 and R6 in the formula (7) or (8) may be identical or different, and each represent hydrogen, an alkyl group, an alkoxide group, an amino group, an alkene, an alkyne, a phenyl group, a phenol group or the like) may also be used. However, at least one (preferably all) of R1, R2, R3, R4, R5 and R6 is the volatile hydrocarbon group described above.

(7)

(8)

For the cyclic siloxane compound, a vinylcyclotetrasiloxane derivative represented by formula (9) (wherein R1, R2, R3, R4, R5, R6 and R7 in the formula (9) may be identical or different, and each represent hydrogen, an alkyl group, an alkoxide group, an amino group, an alkene, an alkyne, a phenyl group, a phenol group or the like) may also be used. However, at least one (preferably all) of R1, R2, R3, R4, R5, R6 and R7 is the volatile hydrocarbon group described above.

(9)

Similarly, the cyclic siloxane compound may also be a pentavinylcyclotetrasiloxane derivative, a hexavinylcyclotetrasiloxane derivative, a heptavinylcyclotetrasiloxane derivative, or an octavinylcyclotetrasiloxane derivative.

It is preferable for the silicon-containing compound that the skeleton includes silicon (Si) and oxygen (O) in a straight chain form. In this case, the silicon-containing compound has, for example, a structure represented by the following formula (3).

(3)

wherein R1 to R6 may be identical or different, and each represent any one selected from the group consisting of hydrogen, a hydrocarbon group, and an oxidized hydrocarbon group;

(3)

wherein R1 to R4 may be identical or different, and each represent any one selected from the group consisting of hydrogen, a hydrocarbon group, and an oxidized hydrocarbon group;

(3)

wherein R1 to R4 may be identical or different, and each represent any one selected from the group consisting of hydrogen, a hydrocarbon group, and an oxidized hydrocarbon group; or (3)

wherein R1 to R4 may be identical or different, and each represent any one selected from the group consisting of hydrogen, a hydrocarbon group, and an oxidized hydrocarbon group.

The silicon-containing compound is, for example, a divinylsiloxanebenzocyclobutene monomer represented by the following formula (10).

(10)

Next, the process for producing a porous insulating film will be described.

Figure 1:
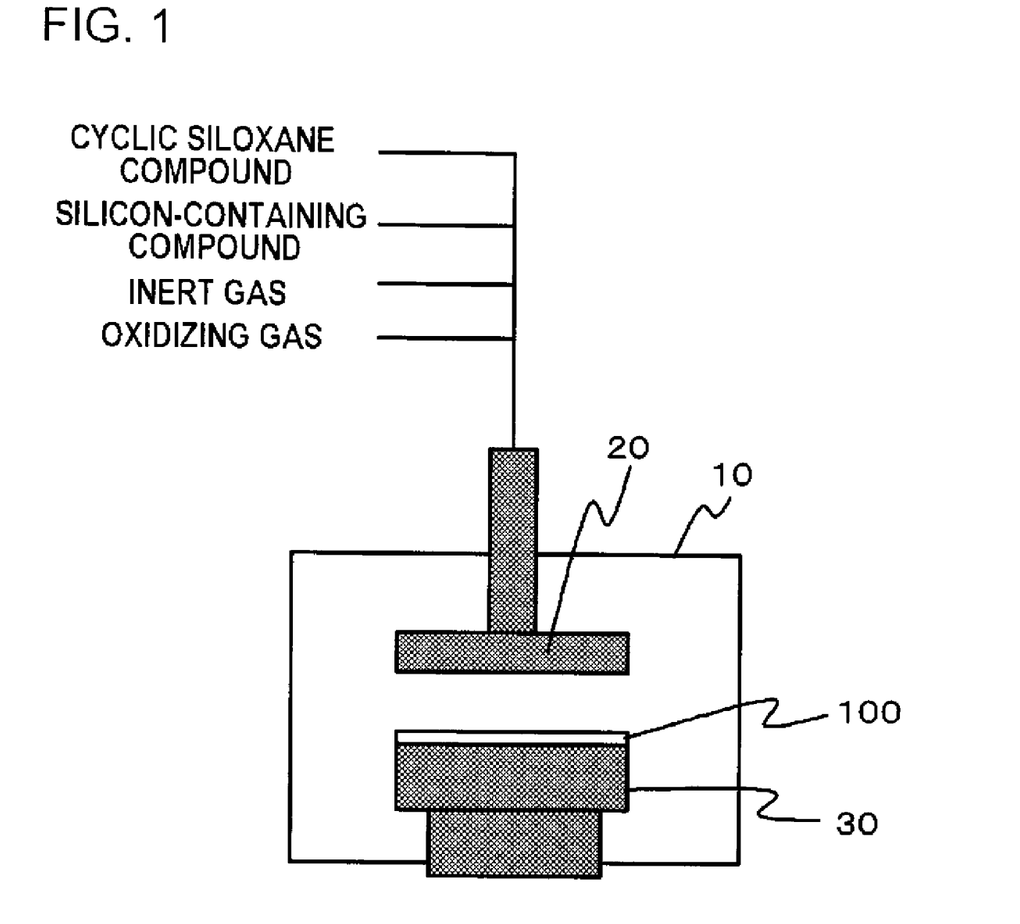
FIG. 1 is a diagram showing the configuration of a film forming apparatus used in the production of a porous insulating film.

FIG. 1 is a diagram showing the configuration of a film forming apparatus used in the production of a porous insulating film. This film forming apparatus has a film forming chamber 10, an upper electrode 20, and a lower electrode 30. The upper electrode 20 and the lower electrode 30 are disposed inside the film forming chamber 10, and are disposed to face each other. The upper electrode 20 is a high frequency electrode to which high frequency is applied, and serves as a shower head. The process gas for film formation is introduced into the film forming chamber 10 from the upper electrode 20. The lower electrode 30 is a ground electrode, over which a substrate 100 is placed. The film forming chamber 10 is also equipped with a ventilation unit that is not shown.

The process gas includes a noble gas (for example, He gas) containing the cyclic siloxane compound, a noble gas (for example, helium (He) gas) containing the silicon-containing compound, and an inert gas (for example, a noble gas such as He, argon (Ar) or xenon (Xe)). The process gas may also contain an oxidizing gas (for example, $N_2O$, $O_2$, CO or $CO_2$) in addition to these gases.

First, the substrate 100 is placed over the lower electrode 30 of the film forming apparatus shown in FIG. 1. Subsequently, a noble gas containing a cyclic siloxane compound, a noble gas containing a silicon-containing compound, and an inert gas are introduced into the film forming chamber 10, and high frequency is applied to the upper electrode 20. Thereby, plasma is generated in the space between the upper electrode 20 and the lower electrode 30 inside the film forming chamber 10. In addition, the oxidizing gas mentioned above may be further introduced into the film forming chamber 10.

Inside the plasma, the cyclic siloxane compound is activated while the volatile hydrocarbon group is bonded to the cyclic siloxane, and the cyclic siloxane compound is deposited over the substrate 100 as an insulating substance. At this time, the silicon-containing compound is activated inside the plasma, and a plurality of cyclic siloxane molecules are bonded to each other through the Si contained in the silicon-containing compound. When the skeleton of the silicon-containing compound is composed of Si and O, a plurality of the cyclic siloxane molecules are bonded to each other through the bonding of Si and O (for example, a straight-chained siloxane). When an oxidizing gas is introduced into the film forming chamber 10, a straight-chained siloxane bonded to a plurality of cyclic siloxane molecules is likely to be generated. The cyclic siloxane constituting the insulating film has a volatile hydrocarbon group bonded thereto.

Subsequently, energy is applied to the insulating film formed over the substrate 100. As for the method of applying energy, there are a method of applying heat to the substrate 100 and the insulating film, a method of irradiating light such as ultraviolet radiation, a method of irradiating charged particles such as electrons, and the like. In the case of applying heat to the substrate 100 and the insulating film, the temperature of the substrate 100 is set to, for example, 150° C. to 400° C. In the case of irradiating light to the insulating film, the wavelength of the light is set to 150 to 350 nm. In the case of irradiating electrons to the insulating film, the energy of the electrons is set to 0.25 to 20 keV. Thereby, the volatile hydrocarbon group bonded to the cyclic siloxane is volatilized, and the parts where the volatile hydrocarbon groups were present in the insulating film become pores. The diameter of these pores is, for example, 1 nm or less. Thus, a porous insulating film is formed over the substrate 100. The porous insulating film is, for example, a porous SiOH film, SiCOH film or SiCON film.

The porous insulating film thus formed contains a plurality of cyclic siloxanes, and the elastic modulus obtained by a nanoindenter is equal to or greater than 5. The elastic modulus obtained by a nanoindenter can be measured with high accuracy when, for example, the thickness of the porous insulating film is equal to or greater than 500 nm. The molecules of the plurality of cyclic siloxanes are bonded to each other through Si or a straight-chained siloxane. The average value of diameter of the pores of the porous insulating film is equal to or less than 1 nm. The porous insulating film has a relative permittivity of equal to or less than 2.7, and a C/Si ratio of equal to or greater than 1 and equal to or less than 3 as a ratio of the number of atoms, and preferably equal to or greater than 2 and equal to or less than 3.

Figure 2:
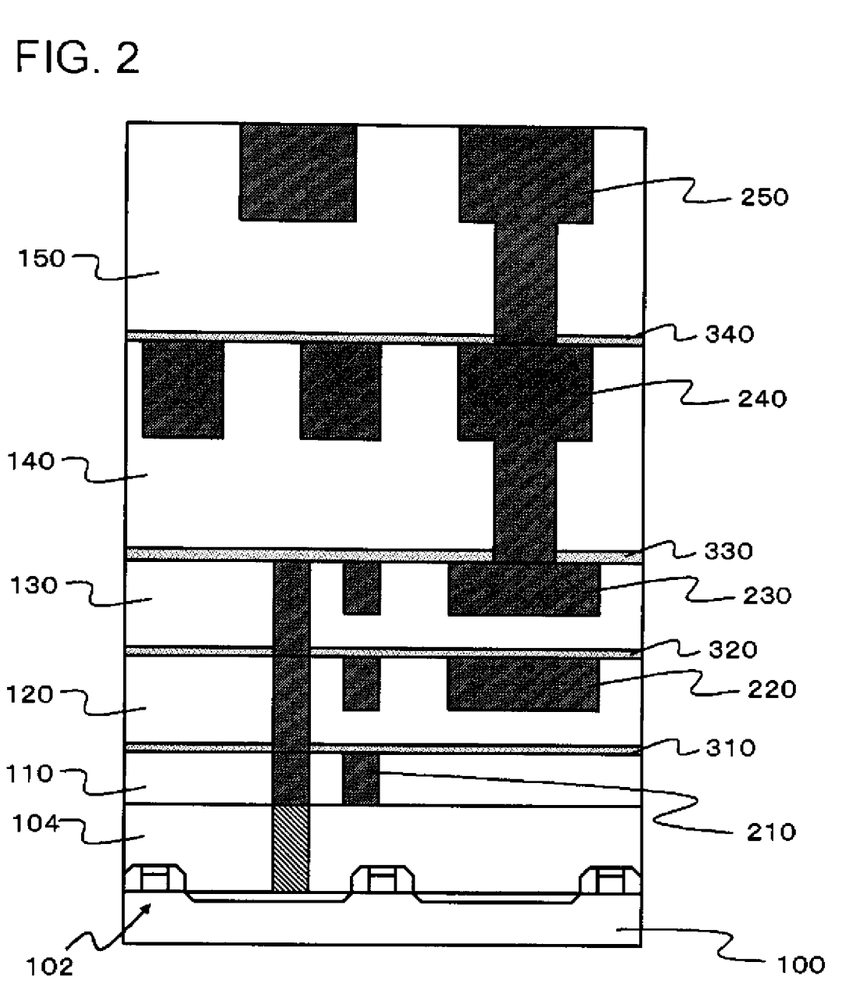
FIG. 2 is an exemplary cross-sectional view of a semiconductor device having a substrate.

FIG. 2 is an exemplary cross-sectional view of a semiconductor device having a substrate 100. The substrate 100 has a transistor 102 formed thereover. An interlayer insulating film 104 and insulating layers 110, 120, 130, 140 and 150 are laminated over the substrate 100 in this sequence.

The interlayer insulating film 104 and the insulating layer 110 are, for example, silicon oxide films. The insulating layer 110 has a conductive pattern 210 buried therein through a barrier metal (not shown). The conductive pattern 210 is, for example, a copper (Cu) interconnect. The conductive pattern 210 is connected to the transistor 102, for example, through a contact buried in the interlayer insulating film 104.

The insulating layers 120, 130 and 140 are porous insulating films described above, and the films are respectively buried in conductive patterns 220, 230 and 240 through barrier metals (not depicted). The conductive patterns 220, 230 and 240 are, for example, Cu interconnects. The method of forming the conductive patterns 210, 220, 230 and 240 may be either the single Damascene method or the dual Damascene method.

Between the insulating layer 110 and the insulating layer 120, there is formed a diffusion preventing film 310. Similarly, diffusion preventing films 320, 330 and 340 are also formed between the insulating layer 120 and the insulating layer 130, between the insulating layer 130 and the insulating layer 140, and between the insulating layer 140 and the insulating layer 150, respectively.

Figure 3:
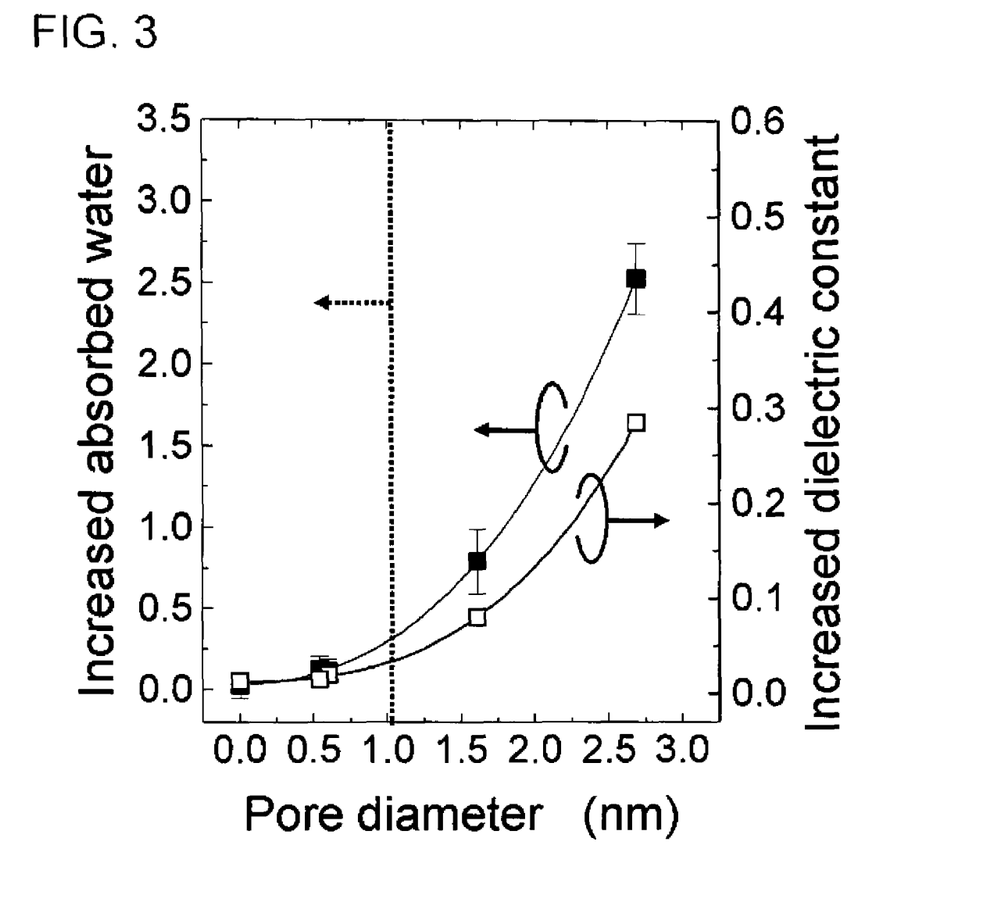
FIG. 3 is a graph showing the respective dependencies on the diameter of pores, of the amount of water absorption in the case of immersing a porous insulating film in water, and of the increment in the relative permittivity obtained before and after the immersion in water.

FIG. 3 is a graph showing the dependencies on the diameter of pores, respectively of the amount of water absorption in the case of immersing the porous insulating film in water, and of the increment in the relative permittivity before and after the immersion in water. As shown by this graph, the amount of water absorption is decreased with a decrease in the diameter of pores, and the increment of the relative permittivity is also decreased. For this reason, as the size of pores of the porous insulating film becomes smaller, the characteristics of the porous insulating film are enhanced. Particularly, when the pore size is controlled to equal to or less than 1 nm, diffusion of moisture, process gas or the like inside the porous insulating film through the pores, can be reduced to a large extent. Therefore, defining the pore size as equal to or less than 1 nm (pore refinement) is effective in obtaining high reliability for semiconductor devices because there is an effect of suppressing gas diffusion in the porous insulating film. According to the present embodiment, since both the cyclic size of the cyclic siloxane, and the pores generated after the detachment of the volatile hydrocarbon group can be adjusted to equal to or less than 1 nm, it is possible to provide a porous insulating film having high reliability.

Subsequently, the action and effects of the present embodiment will be described. In the present embodiment, a volatile hydrocarbon group is included in a side chain of the cyclic siloxane compound. For this reason, unlike the case of introducing a volatile hydrocarbon (porogen) into the film forming chamber 10 as a single substance, aggregation of the volatile hydrocarbon at the time of deposition of the insulating film is suppressed. Therefore, enlargement of the size of the pores in the porous insulating film is suppressed, and the average value of the diameter of the pores becomes equal to or less than 1 nm. The diameter of the pores can be measured by, for example, a small-angle X-ray scattering method.

In regard to the porous insulating film, as described above, when the pore size is large, the amount of moisture absorption is increased, and thereby the dielectric constant of the porous insulating film is increased. Furthermore, when the amount of moisture absorption is increased, the gas components remaining inside the pores may react with moisture to generate a substance that degenerates the porous insulating film (for example, HF). According to the present embodiment, since the diameter of the pores in the porous insulating film can be made small, generation of such problems can be suppressed.

The molecules of the plurality of cyclic siloxanes are bonded to each other through Si or through the bonding of Si and O (including a straight-chained siloxane). Therefore, the strength of the porous insulating film is increased, and as described above, an elastic modulus obtained by a nanoindenter equal to or greater than 5 is obtained.

Furthermore, since the C/Si ratio in the porous insulating film is equal to or greater than 1 and equal to or less than 3, and preferably equal to or greater than 2 and equal to or less than 3, as a ratio of the number of atoms, even if the porous insulating film is exposed to the plasma during etching or ashing in the subsequent processes, a decrease in the carbon content of the porous insulating film causing an increase in the relative permittivity of the porous insulating film, can be suppressed. Therefore, it is possible to reduce the degeneration (increase of dielectric constant) of the porous insulating film that occurs as a result of the etching or oxygen ashing of the porous insulating film, which are processes essential in the Damascene interconnect process, and various plasma treatments.

Example

As the cyclic siloxane compound, a compound was prepared such that a high molecular weight hydrocarbon (the number of carbon atoms being equal to or greater than 2 and equal to or less than 10) was bonded to a side chain of a raw material molecule formed from a 6-membered ring of Si—O having a vinyl group in one of the side chains (trivinylcyclotrisiloxane monomer). Furthermore, dimethyldimethoxysilane (DMDMOS) was prepared as the silicon-containing compound. The cyclic siloxane compound, the silicon-containing compound and oxygen gas were introduced to a film forming chamber 10, and thus an insulating film was formed over a silicon substrate. The insulating film over the silicon substrate was converted to a porous insulating film by irradiating the silicon substrate with ultraviolet radiation (Example).

In addition, diethoxymethylsilane (DEMS) and as a porogen, an alcohol ($C_2H_5OH$, $C_3H_7OH$ or the like) or surfactant molecules, or ethers such as vinyl furyl ether, difuryl ether or vinylfuran, were introduced into the reaction chamber 10, and thus an insulating film was formed over a silicon substrate. The insulating film over the silicon substrate was converted to a porous insulating film by irradiating the silicon substrate with ultraviolet radiation (Comparative Example).

Figure 4:
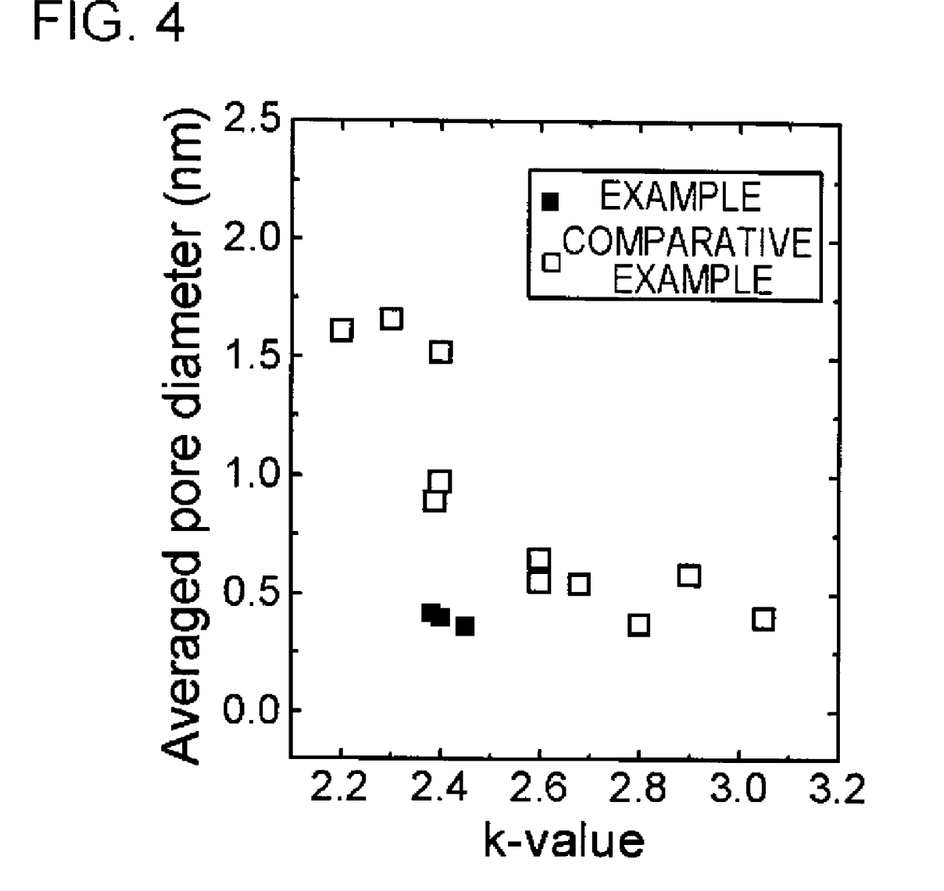
FIG. 4 is a graph showing the relationship between the average value of the diameter of pores and the relative permittivity in the Example.

The average values of the diameter of the pores contained in these porous insulating films were measured by a small angle X-ray diffraction method. The relative permittivity of the porous insulating film was also measured. The results are presented in FIG. 4. It was shown from this diagram that the porous insulating film according to the Example has a smaller average value of the diameter of pores even if the relative permittivity is lowered, as compared with the porous insulating film according to the Comparative Example. This is thought to be because, when the relative permittivity is decreased by increasing the amount of pores, aggregation of the porogen does not occur in the Example, while the porogen undergoes aggregation in the Comparative Example, upon the deposition of the insulating film.

As discussed above, the embodiments and Example of the invention have been described with reference to the drawings, but these are merely exemplary instances of the invention, and various constitutions other than those described above can also be adopted.

It is apparent that the present invention is not limited to the above embodiments, but may be modified and changed without departing from the scope and spirit of the invention.

What is claimed is:

1. A method of manufacturing a porous insulating film comprising:

forming an insulating film over a substrate by introducing a cyclic siloxane compound including a cyclic siloxane as a skeleton and including at least one volatile hydrocarbon group bonded to a side chain, and a silicon-containing compound, into a plasma; and converting said insulating film to a porous insulating film by adding energy to said insulating film, wherein said silicon-containing compound is decomposed using less energy as compared with energy to decompose the skeleton of said cyclic siloxane compound, said volatile hydrocarbon group, and the bond between said cyclic siloxane compound and said volatile hydrocarbon group.

2. The method of manufacturing a porous insulating film as set forth in claim 1, wherein said step of converting said insulating film to said porous insulating film includes forming said porous insulating film by volatilizing said volatile hydrocarbon group contained in said insulating film.

3. The method of manufacturing a porous insulating film as set forth in claim 1, wherein said volatile hydrocarbon group is one selected from the group consisting of the following (a) to (f):

(a) at least one cyclic hydrocarbon including a cyclic structure, represented by the formula:

$C_nH_{2n}$ (wherein n is 4 to 14; the number of carbon atoms in the cyclic structure is 4 to 10; and this at least one cyclic hydrocarbon may include a plurality of simple or branched hydrocarbons substituted at the cyclic structure);

(b) at least one linear or branched, saturated or mono- or polyunsaturated hydrocarbon represented by the formula:

$C_nH_{(2n+2)-2y}$ (wherein n is 2 to 20; and y is 0 to n);

(c) at least one mono- or polyunsaturated cyclic hydrocarbon including a cyclic structure, represented by the formula:

$C_nH_{2n-2x}$ (wherein x is the number of unsaturation sites; n is 4 to 14; the number of carbon atoms in the cyclic structure is 4 to 10; and this at least one mono- or polyunsaturated cyclic hydrocarbon may include a plurality of simple or branched hydrocarbon substituents substituted at the cyclic structure, and may include unsaturation in one of those hydrocarbon substituents or unsaturation within the ring);

(d) at least one bicyclic hydrocarbon including a bicyclic structure, represented by the formula:

$C_nH_{2n-2}$ (wherein n is 4 to 14; the number of carbon atoms in the bicyclic structure is 4 to 12; and this at least one bicyclic hydrocarbon may include a plurality of simple or branched hydrocarbons substituted at the bicyclic structure);

(e) at least one polyunsaturated bicyclic hydrocarbon including a bicyclic structure, represented by the formula:

$C_nH_{2n-(2+2x)}$ (wherein x is the number of unsaturation sites; n is 4 to 14; the number of carbon atoms in the bicyclic structure is 4 to 12; and this at least one polyunsaturated bicyclic hydrocarbon may include a plurality of simple or branched hydrocarbon substituents substituted at the bicyclic structure, and may include unsaturation in one of those hydrocarbon substituents or unsaturation within the ring); and (f) at least one tricyclic hydrocarbon including a tricyclic structure, represented by the formula:

$C_nH_{2n-4}$

(wherein n is 4 to 14; the number of carbon atoms in the tricyclic structure is 4 to 12; and this at least one tricyclic hydrocarbon may include a plurality of simple or branched hydrocarbons substituted at the tricyclic structure).

4. The method of manufacturing a porous insulating film as set forth in claim 1, wherein the number of carbon atoms of said volatile hydrocarbon group is equal to or greater than 2 and equal to or less than 10.

5. The method of manufacturing a porous insulating film as set forth in claim 1, wherein said cyclic siloxane compound is a trivinylcyclotrisiloxane monomer represented by the following formula (1):

(1)

wherein at least one of R1, R2 and R3 is said volatile hydrocarbon group.

6. The method of manufacturing a porous insulating film as set forth in claim 1, wherein said cyclic siloxane compound is a tetravinylcyclotetrasiloxane monomer represented by the following formula (2):

(2)

wherein at least one of R1, R2, R3 and R4 is said volatile hydrocarbon group.

7. The method of manufacturing a porous insulating film as set forth in claim 1,
wherein the skeleton of said silicon-containing compound is composed of silicon (Si) and oxygen (O) in a straight chain form.

8. The method of manufacturing a porous insulating film as set forth in claim 7,
wherein said silicon-containing compound includes a structure represented by the following formula (3):

(3)

wherein R1 to R6 may be identical or different, and each represent any one selected from the group consisting of hydrogen, a hydrocarbon group, and an oxidized hydrocarbon group;
wherein R1 to R4 may be identical or different, and each represent any one selected from the group consisting of hydrogen, a hydrocarbon group, and an oxidized hydrocarbon group;
wherein R1 to R4 may be identical or different, and each represent any one selected from the group consisting of hydrogen, a hydrocarbon group, and an oxidized hydrocarbon group; or
wherein R1 to R4 may be identical or different, and each represent any one selected from the group consisting of hydrogen, a hydrocarbon group, and an oxidized hydrocarbon group.

9. The method of manufacturing a porous insulating film as set forth in claim 1,
wherein an oxidizing agent gas is introduced into said plasma.

10. The method of manufacturing a porous insulating film as set forth in claim 1,
wherein the average value of the pore size in said porous insulating film is equal to or less than 1 nm in diameter.

11. The method of manufacturing a porous insulating film as set forth in claim 1,
wherein the C/Si ratio in said porous insulating film is equal to or more than 1 and equal to or less than 3 as a ratio of the number of atoms.

12. A method of manufacturing a semiconductor device comprising:
forming a porous insulating film by the method of manufacturing a porous insulating film as set forth in claim 1.

* * * * *